US010696184B2

(12) United States Patent
Tang et al.

(10) Patent No.: US 10,696,184 B2
(45) Date of Patent: Jun. 30, 2020

(54) ONBOARD CHARGER HEAT DISSIPATION

(71) Applicant: AitronX Inc., Fremont, CA (US)

(72) Inventors: Xinlu Tang, Fremont, CA (US); Jiangwei Li, Fremont, CA (US)

(73) Assignee: AitronX Inc., Saratoga, CA (US)

(*) Notice: Subject to any disclaimer, the term of this patent is extended or adjusted under 35 U.S.C. 154(b) by 0 days.

(21) Appl. No.: 16/264,150

(22) Filed: Jan. 31, 2019

(65) Prior Publication Data

US 2019/0263280 A1  Aug. 29, 2019

Related U.S. Application Data

(60) Provisional application No. 62/635,006, filed on Feb. 26, 2018.

(51) Int. Cl.
*H05K 3/32*  (2006.01)
*H05K 7/20*  (2006.01)
*G02B 6/00*  (2006.01)
*B60L 53/302* (2019.01)

(52) U.S. Cl.
CPC ........ *B60L 53/302* (2019.02); *H05K 7/20263* (2013.01); *H05K 7/20272* (2013.01); *H05K 7/20927* (2013.01)

(58) Field of Classification Search
CPC .......... H05K 3/32; H05K 3/325; H05K 3/341; H05K 7/20; H05K 7/20927; H05K 7/2049; H05K 7/20854; G02B 6/00
USPC ................ 361/699, 719; 174/535, 547, 551; 165/104.26, 104.33, 170, 80.2
See application file for complete search history.

(56) References Cited

U.S. PATENT DOCUMENTS

| | | | | |
|---|---|---|---|---|
| 4,524,238 A | * | 6/1985 | Butt | H01L 23/047 174/539 |
| 2003/0160336 A1 | * | 8/2003 | Kong | H05K 3/325 257/779 |
| 2006/0272798 A1 | * | 12/2006 | Liu | H01L 23/427 165/104.33 |
| 2008/0080832 A1 | * | 4/2008 | Chen | B81B 3/0005 385/147 |
| 2008/0278918 A1 | * | 11/2008 | Tominaga | B62D 5/0406 361/719 |
| 2009/0178792 A1 | * | 7/2009 | Mori | F28F 3/12 165/170 |
| 2012/0250252 A1 | * | 10/2012 | Iguchi | H05K 7/20927 361/689 |
| 2013/0265129 A1 | * | 10/2013 | Ansari | H01F 27/22 336/61 |
| 2014/0015119 A1 | * | 1/2014 | Bonkohara | H01L 23/473 257/713 |
| 2014/0262150 A1 | * | 9/2014 | Icoz | H05K 7/20927 165/80.2 |
| 2014/0300382 A1 | * | 10/2014 | Eckert | G01R 31/2886 324/756.01 |

* cited by examiner

Primary Examiner — Xiaoliang Chen
(74) Attorney, Agent, or Firm — Young Basile Hanlon & MacFarlane, P.C.

(57) ABSTRACT

A casing for an onboard charger includes a sidewall having a first height and an internal wall having a second height less than the first height. A channel is defined by the internal wall and the sidewall. An inlet connects to a first end of the channel and an outlet connects to a second end of the channel. A heat dissipating liquid can flow into the channel through the inlet and out of the channel through the outlet.

11 Claims, 6 Drawing Sheets

ONBOARD CHARGER HEAT DISSIPATION

CROSS-REFERENCE TO RELATED APPLICATION

This application claims priority to U.S. Provisional Patent Application No. 62/635,006, filed Feb. 26, 2018, which is incorporated herein in its entirety by reference.

TECHNICAL FIELD

This disclosure relates to heat dissipation, and more particularly, to heat dissipation for vehicle onboard chargers.

BACKGROUND

Electric vehicles are developed to decrease the dependence on fossil fuels. To recharge an electric vehicle, wired or wireless charging solutions can be used. For example, wired charging solutions can include an onboard charger (OBC) installed on a vehicle for converting electric power (e.g., alternating currents or AC) input into the vehicle into direct current (DC) for charging onboard energy storage (e.g., batteries).

During the charging process, components of the OBC can generate heat. When a temperature of the components reaches a threshold, the OBC may fail to function, or a protection mechanism of the OBC may derate power output of the OBC.

SUMMARY

One aspect of this disclosure is a casing for an onboard charger. The casing comprises a sidewall having a first height and an internal wall having a second height less than the first height. A channel is defined by the internal wall and the sidewall. An inlet connects to a first end of the channel and an outlet connects to a second end of the channel. A heat dissipating liquid can flow into the channel through the inlet and out of the channel through the outlet.

Another aspect of this disclosure is an onboard charger. The onboard charger comprises a casing including a sidewall having a first height. The casing includes an internal wall having a second height less than the first height. A top wall connects the internal wall to the sidewall. A channel is defined by the internal wall, the sidewall, and the top wall. An inlet is in fluid communication with a first end of the channel and an outlet is in fluid communication with a second end of the channel. A first cover is provided on a top surface of the sidewall. A first heat-dissipating component is arranged between the top wall and the first cover. The first heat-dissipating component contacts the top wall.

Another aspect of this disclosure is a casing for an onboard charger. The casing comprises a sidewall having a first height and an internal wall having a second height less than the first height. A top wall connects the internal wall to the sidewall. A first cover is disposed on a top surface of the sidewall, and a gap is defined between the first cover and the top wall. A second cover is disposed on a bottom surface of the sidewall. The sidewall, the internal wall, the top wall, and the second cover define a channel including an inlet and an outlet. A portion of the second cover includes an exterior profile corresponding to an interior profile of the channel.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity. Unless otherwise noted, like numerals represent like elements within the drawing figures.

DETAILED DESCRIPTION

Typical heating elements (also referred to as heating components or heat-dissipating components) of a vehicle onboard charger (OBC) can include power electronics (e.g., insulated-gate bipolar transistors (IGBTs) or SiC power chips), transformers, and inductors. A 10 kW OBC can have a typical power efficiency of 90% to 95% and the heating components can generate approximately 500-1000 Watts of heat. For example, an IGBT typically generates 50-100 Watts of heat.

Effective heat dissipation of the OBC's heating components is important for proper operation of the OBC. When a temperature of one or more of the heating components reaches a threshold, the heating components, including the power electronics of the OBC, can burn out. In addition, an increase in temperature of a transformer's ferrite core can cause changes in its magnetic properties and result in coupling performance deterioration.

To cool the heating components of the OBC, a liquid-cooling system such as a liquid-cold plate (LCP) can be used. LCPs having greater heat dissipation capability can have a thickness of more than 2 cm. As such, LCP cooling solutions tend to increase the overall height and/or size of OBCs. Reducing the height and overall size of OBCs is a concern of electric vehicle manufacturers.

To provide efficient heat dissipation for OBCs of a reduced size, systems, apparatuses, and methods for thermal management are disclosed herein. A casing of an OBC using liquid cooling can include a liquid channel (also referred to as a channel). Liquid coolant can flow through the liquid channel to cool the OBC. The liquid channel can extend along one or more sidewalls of the casing. The casing surrounds internal components of the OBC. Heat-dissipating components (e.g., power electronics) of the OBC can be arranged to contact walls of the liquid channel directly or through a heat-transferring medium (e.g., thermal grease).

One or more potting chambers can be provided in the casing near the liquid channel. For example, a potting chamber can be defined by one or more chamber walls and one or more walls of the liquid channel. Heat may be transferred from the potting chamber, to one or more walls of the liquid channel, and into the liquid coolant flowing through the liquid channel. Heat-dissipating components (e.g., transformers and inductors) can be arranged inside the potting chambers. Heat-dissipating components can be potted inside the potting chambers using potting materials. The potting materials can transfer heat dissipated from the heat-dissipating components to the one or more of the liquid channel walls to increase heat-dissipating efficiency of the OBC casing. According to implementations of this disclosure, the overall size and/or height of the OBC can be reduced using this increased heat-dissipation efficiency.

Figure 1:
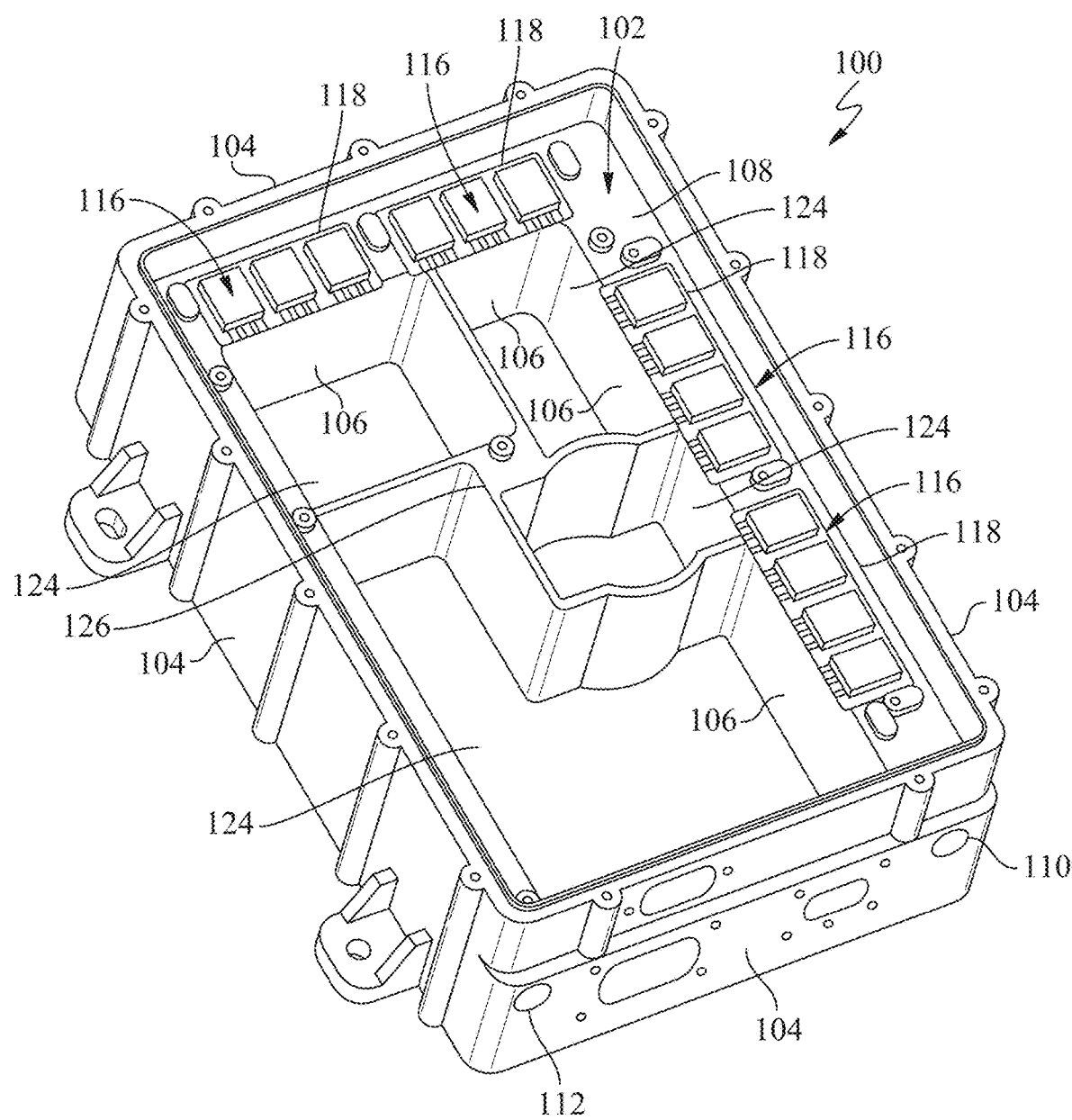
FIG. 1 is a perspective view of an onboard charger casing.

FIG. 1 shows a perspective view of an OBC casing 100 including an example of a liquid channel (also referred to as a channel) 102 for heat dissipation. The OBC casing 100 can include a sidewall 104 having a first height. The sidewall 104 can extend around a periphery of the OBC casing 100 and can include four sides. The sidewall 104 can define a rectangular shape but can define any other shape and include any number of sides. The liquid channel 102 can be arranged around an interior of the OBC casing 100, such as on an interior surface the sidewall 104 of the OBC casing 100. The liquid channel 102 can be arranged on three sides of the sidewall 104. In other implementations, the liquid channel 102 can be arranged on more or less than three sides of the sidewall 104.

The OBC casing 100 can include an internal wall 106 having a second height. The second height of the internal wall 106 can be less than the first height of the sidewall 104. In other implementations, the internal wall 106 and the sidewall 104 can have any height relative to each other. The internal wall 106 can extend along three sides of the sidewall 104. In other implementations, the internal wall 106 can extend along more or less than three sides of the sidewall 104. The liquid channel 102 can be defined by the sidewall 104 and the internal wall 106 inside the OBC casing 100. The internal wall 106 can include an upper portion (also referred to as a top wall) 108 that connects the internal wall 106 to the sidewall 104 to define the liquid channel 102 between the top wall 108, the internal wall 106, and the sidewall 104.

The liquid channel 102 can be a channel-like connecting space enclosed by the sidewall 104 and the internal wall 106 of the OBC casing 100. In some implementations, the liquid channel 102 can be arranged on portions of the sidewall 104 (i.e., not arranged to extend along an entire length of sides of the sidewall 104). Cool coolant (also referred to as heat dissipating liquid) can flow into the liquid channel 102 through an inlet 110 and out of the liquid channel 102 though an outlet 112. The inlet 110 can be in fluid communication with a first end of the liquid channel 102 and the outlet 112 can be in fluid communication with a second end of the liquid channel 102. The coolant can flow through the liquid channel 102 to absorb heat generated by heating components inside the OBC casing 100 and become hot coolant. The hot coolant carries the absorbed heat out of the OBC casing 100 through the outlet 112. The hot coolant can be cooled by an external heat exchange system included in the vehicle. The inlet 110 and the outlet 112 can be arranged on a same side of the sidewall 104 but may be arranged on different sides of the sidewall 104. The inlet 110 and the outlet 112 can be arranged on a side of the sidewall 104 on which the liquid channel 102 is not arranged. In other implementations, the inlet 110 and the outlet 112 can be arranged on any side of the sidewall 104 or on any other portion of the OBC casing 100. It should be noted that positions of the inlet 110 and the outlet 112 can be arranged according to any configuration of the liquid channel 102. Positions of the inlet 110 and the outlet 112 and the configuration of the liquid channel 102 are not limited to the examples shown and described.

In some implementations, a top cover 114 (also referred to as a first cover and shown in FIG. 6) can be coupled to a top surface of the OBC casing 100. The top cover 114 can be coupled to a top surface of the sidewall 104 along a periphery of the OBC casing 100 using screws, bolts, rivets, welding, or any other means of attachment. In other implementations, the top cover 114 can be coupled to any other portion of the OBC casing 100. An O-ring can be disposed between the OBC casing 100 and the top cover 114 for sealing. A gap may be defined between the top cover 114 and the top wall 108 such that the top cover 114 does not directly contact the top wall 108 and/or the internal wall 106. Power components (e.g., IGBTs, transformers, and/or inductors), power boards, and/or controller boards can be arranged in the OBC casing 100 and covered by the top cover 114.

A top surface of the liquid channel 102 (i.e., a top surface the top wall 108) can be lower than the height of the sidewall 104. Space between the top wall 108 and the top surface of the sidewall 104 can provide space for installing power components in the OBC casing 100. Space between the top wall 108 and the top cover 114 can also provide space for installing power components in the OBC casing 100. IGBTs 116 or other heating components can be arranged between the top wall 108 and the top cover 114 such that the heating component contacts the top wall 108. For example, power electronics, such as the IGBTs 116, can be mounted on the top surface of the top wall 108. In other implementations, the IGBTs 116 can be mounted to other portions of the internal wall 106 or any other location on the OBC casing 100. Heat generated by the power electronics can be transferred to the coolant in the liquid channel 102 through the top wall 108. In some implementations, a ceramic substrate 118 can be provided for insulation between the IGBTs 116 and the internal wall 106 (e.g. the top surface of the top wall 108). The ceramic substrate 118 can be 0.4 mm thick or have any other thickness. The ceramic substrate 118 can be made of more than 96% Aluminum Oxide or can include any composition of any other materials. In some implementations, a film (e.g., a thin film) of thermal grease can be provided on one or more sides of the ceramic substrate 118 to assist heat transfer. The thermal grease can contact the internal wall 106 (e.g. the top wall 108), one or more of the IGBTs 116, and/or any other heating component. It should be noted that various heat transfer means can be used between the power electronics and the internal wall 106 and are not limited to the examples shown and described.

Figure 2:
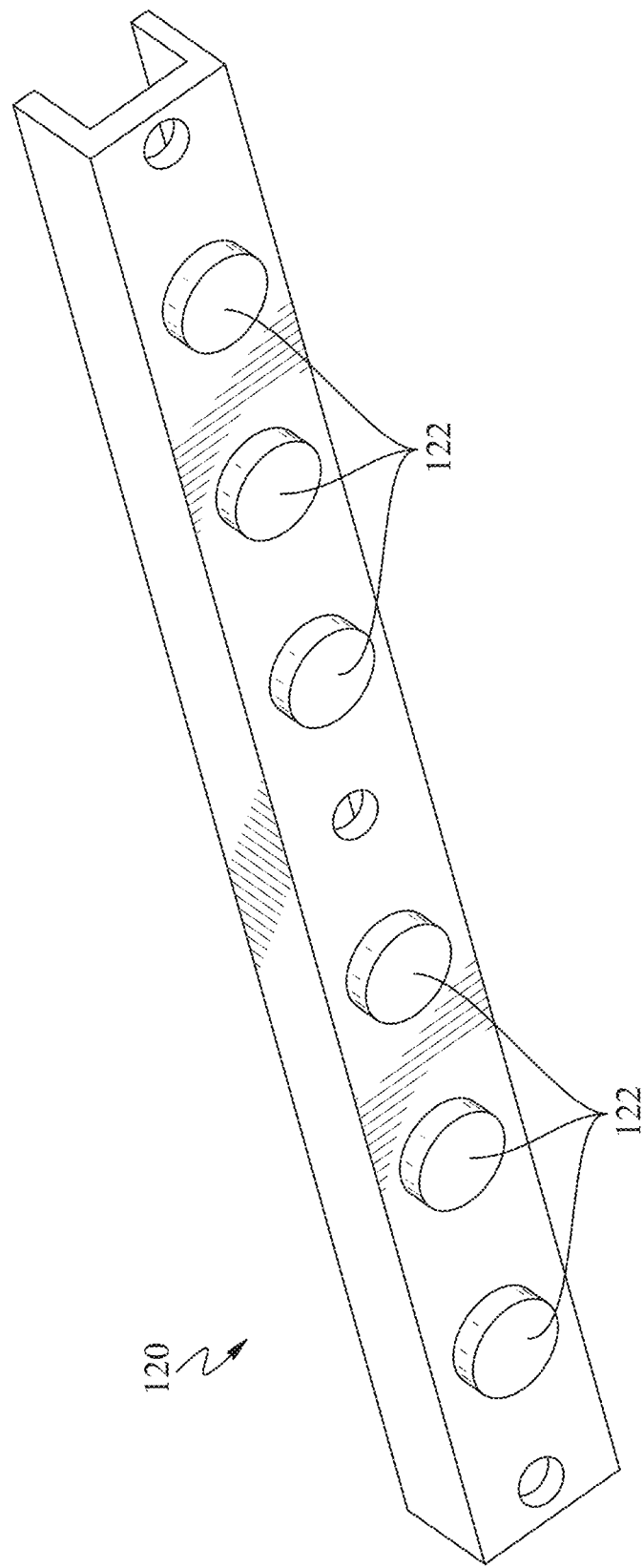
FIG. 2 is a perspective view of a clamp bar.

FIG. 2 shows a perspective view of a clamp bar 120. One or more clamp bars 120 can be mounted onto the IGBTs 116 to press the IGBTs 116 for firm contact between the IGBTs 116 and the top surface of the top wall 108. The clamp bars 120 can include elastic means such as springs to press the IGBTs 116 into the top surface of the top wall 108. Multiple springs 122 can be provided on the clamp bar 120. Each spring 122 can be arranged between the clamp bar 120 and one or more IGBTs 116 to press the one or more IGBTs 116 into the top surface of the top wall 108. It should be noted that various elastic means can be used for the aforementioned purpose and are not limited to springs. The springs 122 can include compression springs or springs of any other type. The springs 122 can have any shape and are not limited to a round shape as shown in FIG. 2. The springs 122 can be in any configuration and are not limited to one spring 122 per IGBT 116. Each spring 122 can include a spring cover enclosing each spring 122. Each spring cover can be disposed between each spring 122 and one or more IGBTs 116. In other implementations, each spring cover may enclose more than one spring 122. The spring cover can be coupled to the clamp bar 120 and may move relative to the clamp bar 120 to allow compression and expansion of each spring 122. The spring covers can be cylindrical but can have any shape.

Referring back to FIG. 1, one or more potting chambers 124 can be arranged inside the OBC casing 100 and outside the liquid channel 102. Each of the potting chambers 124 can include a chamber wall 126 arranged in the OBC casing 100 and outside the liquid channel 102. Each of the potting chambers 124 can be defined by one or more chamber walls 126 and the internal wall 106. Heating components, such as the transformers and/or inductors, can be arranged in the potting chambers 124. The heating components can be encapsulated using a potting technique, such as by injecting potting materials (e.g. thermal-conductive material) into the potting chambers 124. The potting materials can contact the heating components arranged in the potting chambers 124 and can contact the internal wall 106. The potting materials can transfer heat from the heating components to the liquid channel 102 (e.g., through the internal wall 106), and electrically insulate the heating components between each other and/or the OBC casing 100. The potting materials can be selected to have high thermal conductivity and low electric conductivity. For example, the potting materials can include silicone potting compounds.

In some implementations, the potting chambers 124 can be shaped to adapt to the profiles and/or shapes of the heating components for improving heat transfer. In some implementations, a gap (e.g., 1 or 2 mm) can be defined between the heating components installed in the potting chambers 124 and the liquid channel 102 (e.g. the internal wall 106). The gap can improve electric insulation of the heating components. In some implementations, the potting chambers 124 can be arranged at a corner of the liquid channel 102 (e.g. at a corner of the internal wall 106) as shown in FIG. 1, which can maximize the usage of surfaces of the internal wall 106 for cooling and can improve heat dissipation performance.

In some implementations, a power board 127 (shown in FIG. 6) can be installed on top of the IGBTs 116. One or more of the IGBTs 116 can be mounted to the power board 127. The power board 127 may be provided between the top cover 114 and the IGBTs 116 or any other heating component. The power board 127 can be a printed circuit board (PCB). Additional components (e.g., electromagnetic components, large capacitors, inductors, relays, chokes or any other heating component), especially components having large sizes, can be mounted on a side of the power board 127 facing inside of the OBC casing 100. The power board 127 can include one or more holes and/or cutouts through which lead wires from the components mounted on the power board 127 may extend. The power board 127 can be connected to one or more IGBTs 116 mounted to the top wall 108 and/or one or more heating components installed in the potting chambers 124. In some implementations, the transformers and/or inductors can be soldered on the power board 127.

In some implementations, a controller board and/or a daughter board 129 (shown in FIG. 6) can be provided above the power board 127 for providing controlling means for the OBC. The height of the sidewall 104 and/or the internal wall 106 can be designed to a maximum height within the OBC casing 100 to provide a maximum cross-section of liquid flow within the liquid channel 102 and to retain the aforementioned arrangement of the power electronics, the heating components, the power board 127, and the controller board 129 within the OBC casing 100.

Figure 3:
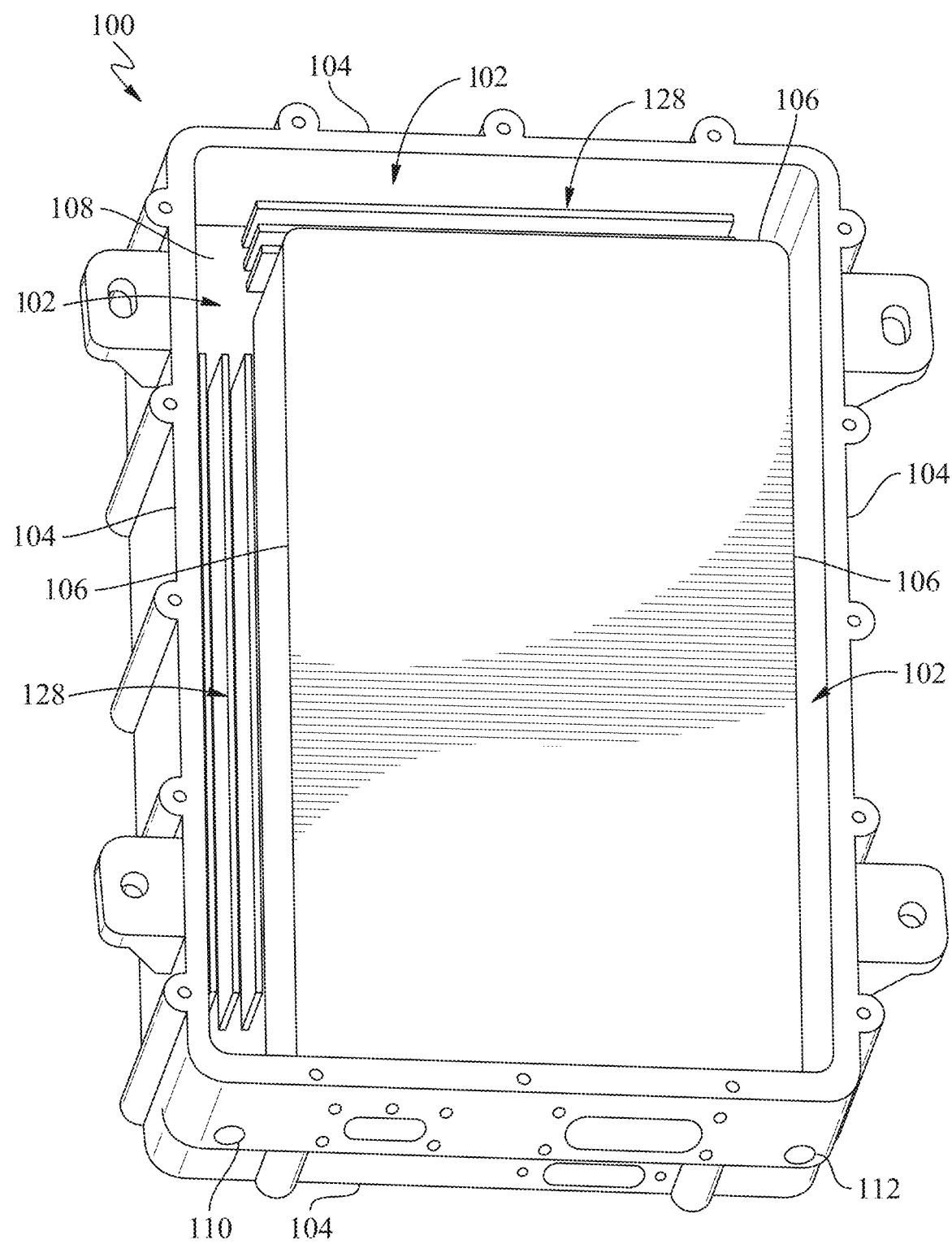
FIG. 3 is a perspective view of a bottom of the onboard charger casing.

FIG. 3 is a perspective view of a bottom of the OBC casing 100. In FIG. 3, the inside of the liquid channel 102 is shown. Liquid coolant can run through the liquid channel 102 via the inlet 110 and outlet 112. As shown in FIG. 3, the cross-section of the liquid channel 102 can diminish along the direction of liquid flow. A first cross section of the liquid channel 102 near the inlet 110 can be larger than a second cross section of the liquid channel 102 near the outlet 112. In some implementations, the liquid channel 102 can include a third cross-section between the first cross section and the second cross section. The third cross section can be smaller than the first cross-section and larger than the second cross-section. That is, a cross-section of an inlet portion of the liquid channel 102 (i.e., a portion of the liquid channel 102 connected to the inlet 110) is larger than or equal to a cross-section of a middle portion (i.e., a portion of the liquid channel 102 downstream of the inlet portion), which is further larger than a cross-section of an outlet portion (i.e., a portion of the liquid channel 102 connected to the outlet 112). Under a certain liquid flow rate, this design can cause the volume of cool coolant (near the inlet 110) to be larger than the volume of the hot coolant (near the outlet 112) which has absorbed heat transferred from the heating components in the OBC casing 100. This design can increase the heat absorption capacity of the coolant. In addition, heating components generating low or no heat (referred to as "non-heating components") can be arranged near portions of the liquid channel 102 having smaller cross sections (e.g., near the second cross-section or the outlet portion). By reducing the cross section of portions of the liquid channel 102 near the location of non-heating components, internal space of the OBC casing 100 can be increased, and more components can be retained in the OBC casing 100. Non-heating components may be connected to the power board 127.

It should be noted that the cross-section geometries of the liquid channel 102 can have other configurations to lower flow resistance and increase flow rates and are not limited to the examples as shown and described.

In some implementations, one or more heatsinks can be mounted inside the liquid channel 102 for increasing a heat transfer rate within the coolant. For example, one or more heatsinks can be mounted on the internal wall 106 and/or the sidewall 104. The heatsinks can include fins, pins, or any suitable structure for heat transfer. For example, multiple heatsink fins 128 are installed inside the liquid channel 102 as shown in FIG. 3. In FIG. 3, the heatsink fins 128 are installed in the inlet portion and the middle portion of the liquid channel 102. Also, the heatsink fins 128 are installed such that their longitudinal direction is along the direction of the liquid flow through the liquid channel 102. It should be noted that any number of the heatsinks can be installed in any location in the liquid channel 102 and positions of the heatsinks are not limited to the example positions shown and described. The heatsinks can have any shape, geometry, size, and orientation.

Optimizations can be performed to optimize the characteristics and properties of the heatsinks for various liquid flow conditions, such as pressure drop versus flow rate requirements. The heatsinks can also be shaped and optimized to cause turbulence in the liquid flow to further increase heat transfer efficiency. For example, computer-aided design (CAD) simulations can be performed to find configurations of the heatsinks optimum for heat dissipation.

Figure 4:
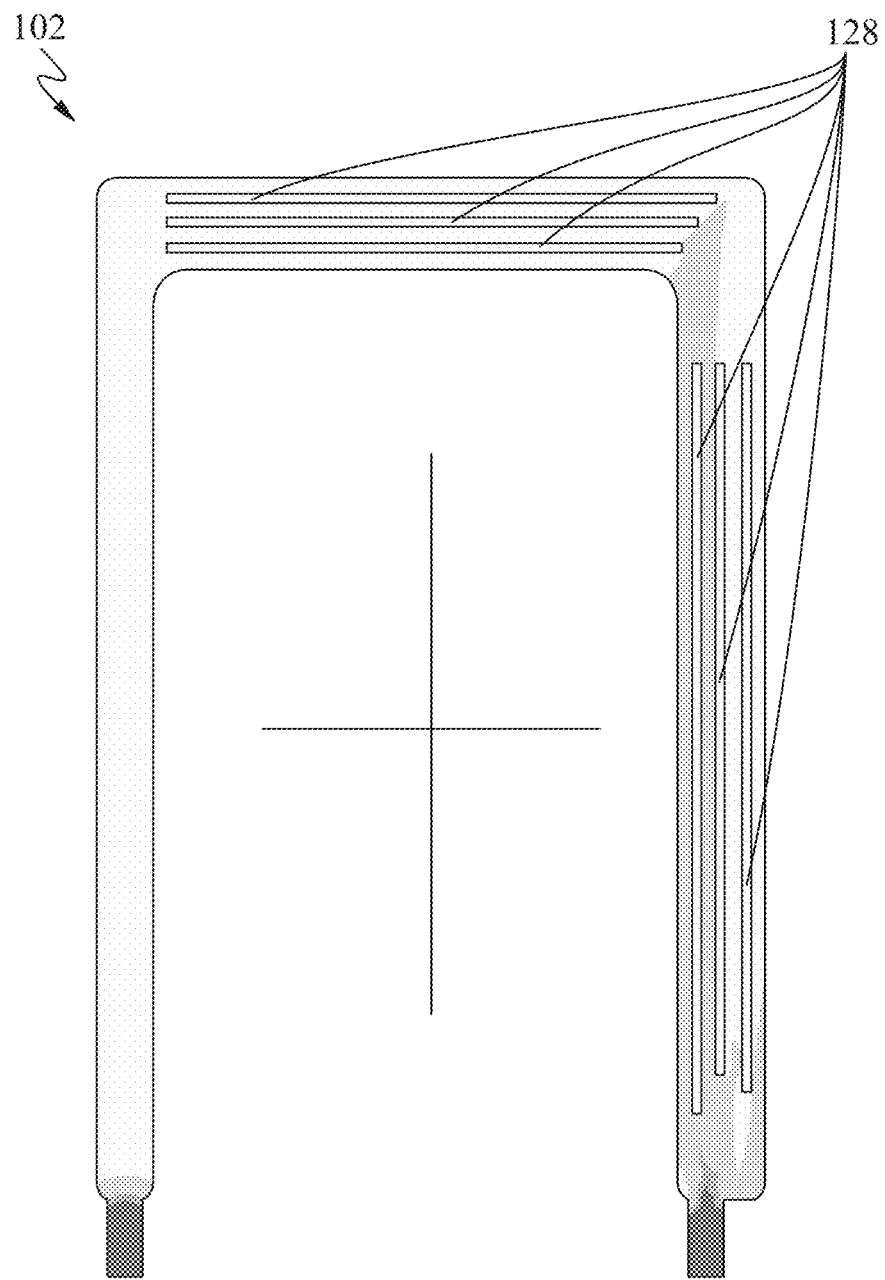
FIG. 4 is cross-sectional view of a liquid channel in the onboard charger casing showing one example of a CAD simulation of liquid flow velocity inside the liquid channel.

FIG. 4 is cross-sectional view of the liquid channel 102 showing one example of a CAD simulation of liquid flow velocity inside the liquid channel 102. In FIG. 4, the heatsink fins 128 are shown as white rectangles. Shading indicates different velocities of the liquid flow inside the liquid channel 102. Darker shading indicates a higher velocity of the liquid flow, for example approximately 1.326-1.768 meters/second. Lighter shading indicates a lower velocity of liquid flow, for example approximately 0.442-1.326 meters/second. Areas shown in white inside the liquid channel 102 indicate a velocity of liquid flow lower than that indicated by the areas having lighter shading, for example approximately 0-0.442 meters/second. The velocity of liquid flow in the liquid channel 102 is not limited to the examples shown and described. By adjusting the configuration of the heatsink fins 128, the optimum fluid flow rate and heat transfer efficiency can be found, and the corresponding configurations of the heatsink fins 128 can be selected for use.

Figure 5:
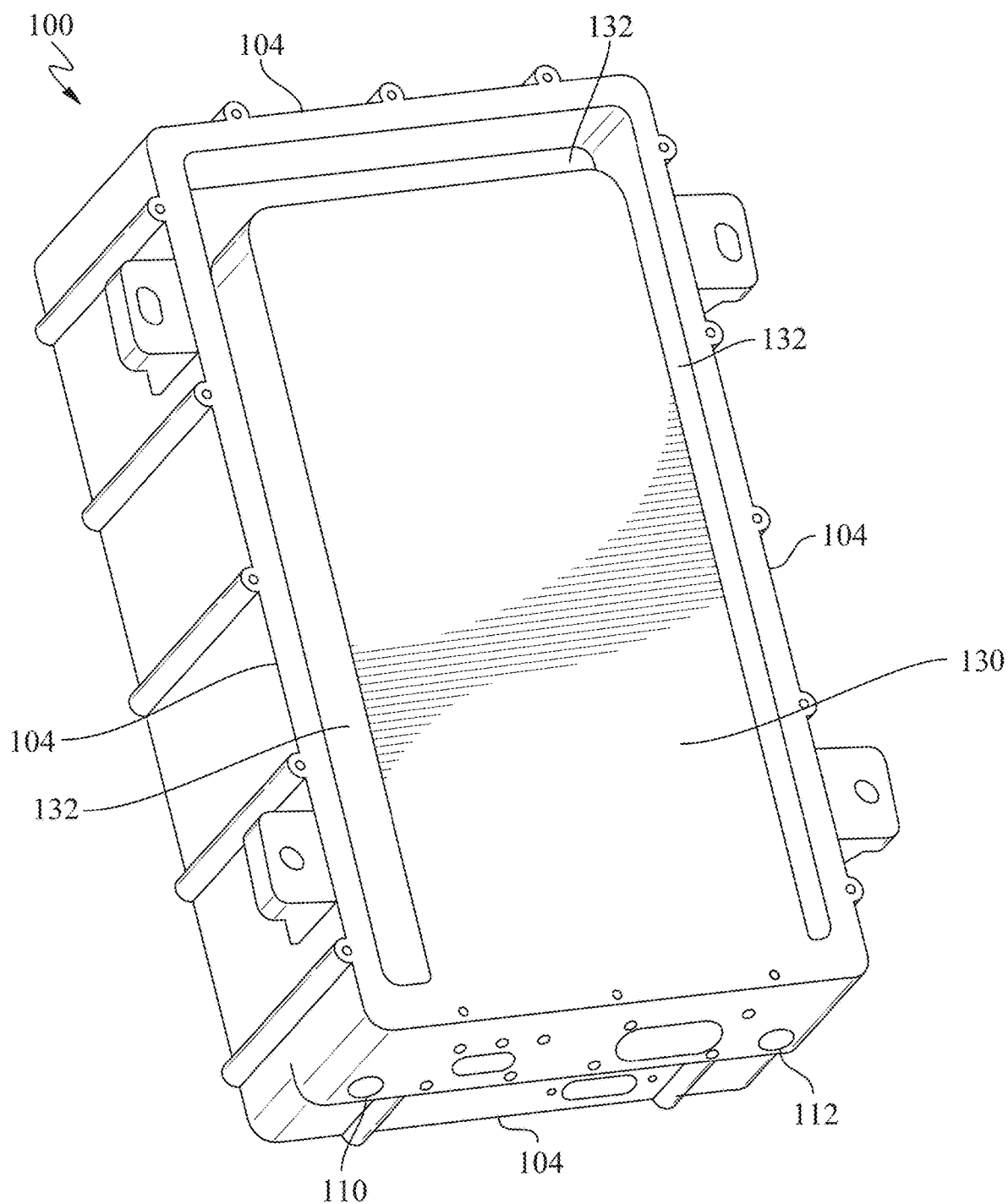
FIG. 5 is a perspective view of the bottom of the OBC casing including a bottom cover.

FIG. 5 is a perspective view of the bottom of the OBC casing 100 including a bottom cover (also referred to as a second cover) 130. The bottom cover 130 can be coupled to a bottom surface of the OBC casing 100. The bottom cover 130 can be coupled to the bottom surface of the sidewall 104 along a periphery of the OBC casing 100 using screws, bolts, rivets, welding, or means of attachment. In other implementations, the bottom cover 130 can be coupled to any other portion of the OBC casing 100. In FIG. 5, the bottom cover 130 includes a convex rim (also referred to as a rim) 132 indented into the liquid channel 102 for mating and/or securing the bottom cover 130 to the liquid channel 102, which can reduce the overall weight of the OBC. A portion of the convex rim 132 can include an exterior profile shaped and sized to correspond to an interior profile of the liquid channel 102. The convex rim 132 can protrude into the liquid channel 102 and contact the internal wall 106 and/or the sidewall 104. The bottom cover 130, the sidewall 104, and the internal wall 106 (including the top wall 108 of the internal wall 106), can define and/or enclose the liquid channel 102. An O-ring can be disposed between the OBC casing 100 and the bottom cover 130 for sealing.

Figure 6:
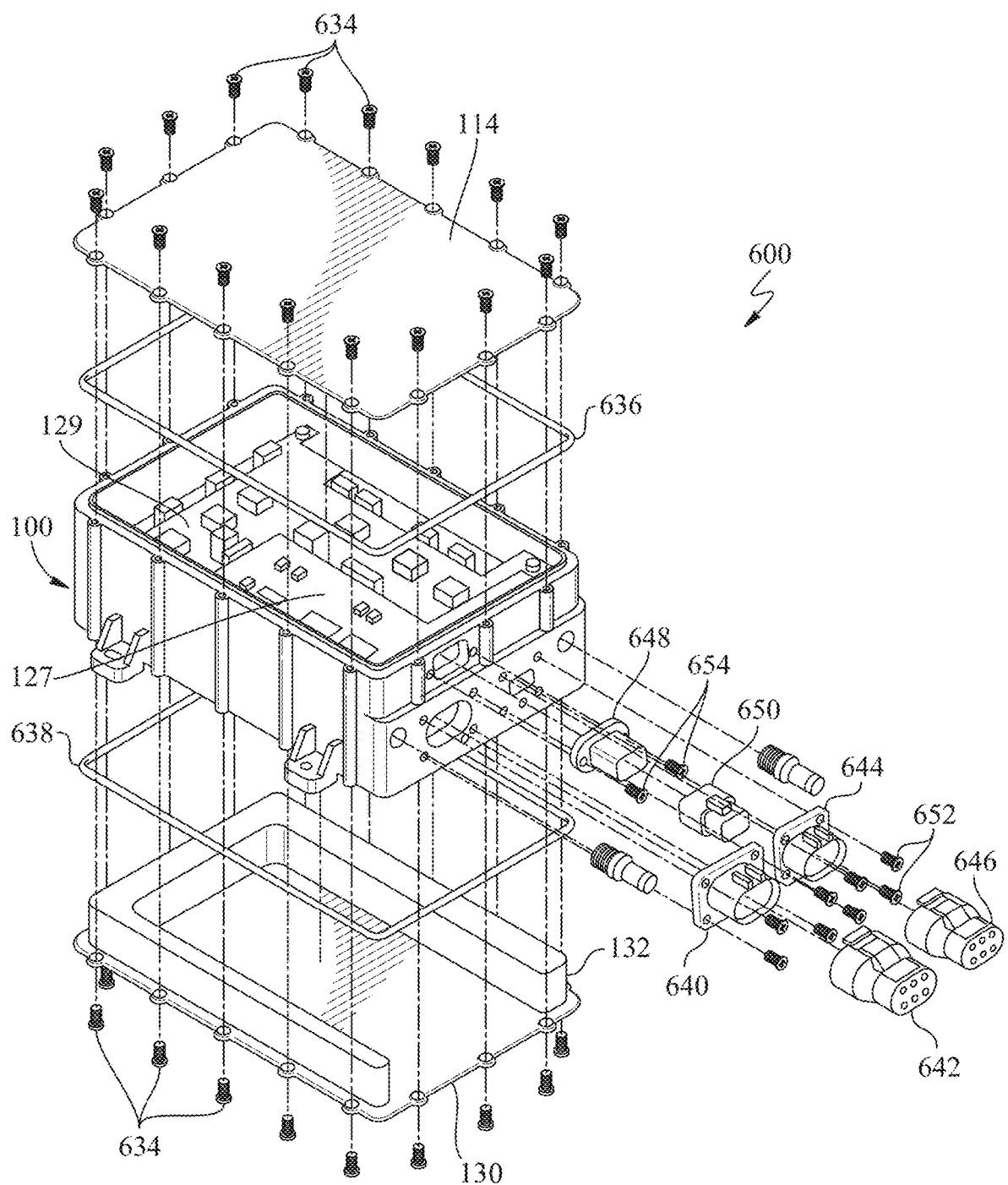
FIG. 6 is an exploded view of an onboard charger including the onboard charger casing.

FIG. 6 shows an exploded view of an OBC 600 including the OBC casing 100 according to implementations of this disclosure. The OBC 600 shown in FIG. 6 includes the OBC casing 100 described with respect to FIGS. 1-5 interfacing with additional components. Broken lines are included in FIG. 6 to indicate the direction of component attachment. The top cover 114 can be mounted to the OBC casing 100 using screws 634. An O-ring 636 can be provided between the top cover 114 and the OBC casing 100 for sealing. The bottom cover 130 can be mounted to the OBC casing 100 using the screws 634 for sealing the liquid channel 102. An O-ring 638 can be provided between the bottom cover 130 and the OBC casing 100 for sealing.

A power inlet 640 can mate with a power connector 642 and a power outlet 644 can mate with a power connector 646 to interface with the components installed in the OBC casing 100 for power supply. A controller port 648 can mate with a controller connector 650 to interface with the controller board 129 to send and receive control signals and data. The power inlet 640, power outlet 644, and the controller port 648 can be mounted to the OBC casing 100 using screws 652 and 654.

As set forth in FIGS. 1-6 and in the corresponding description, the OBC casing described herein can have a smaller size compared with LCP-based systems. The described OBC casing therefore can more easily meet the sizing limitations of OBC manufacturers. The described arrangement of the heating and non-heating components inside the OBC casing can cause more efficient heat transfer. For example, heat from the IGBTs can be more efficiently dissipated due to the direct contact between the IGBTs and the liquid channel (e.g. contact between the IGBTs and the internal wall). The optimized design of the described heatsinks inside the liquid channel can also contribute to improved heat dissipation. The positioning of the potting chambers relative to the liquid channel improves dissipation of the heat generated by the heating components installed in the potting chambers. The potting materials encapsulating the heating components further improve the rate of heat dissipation due to the large amount of contact between the potting materials and the heating components. By arranging the liquid channel around the sidewalls of the OBC casing, the area of the OBC casing cooled by the liquid coolant is increased, further improving heat dissipation.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this disclosure, the term "or" is intended to mean an inclusive "or" rather than an exclusive "or" for two or more elements it conjoins. That is, unless specified otherwise, or clear from context, "X includes A or B" is intended to mean any of the natural inclusive permutations. In other words, if X includes A; X includes B; or X includes both A and B, then "X includes A or B" is satisfied under any of the foregoing instances. The term "and/or" used in this disclosure is intended to mean an "and" or an inclusive "or." That is, unless specified otherwise, or clear from context, "X includes A, B, and/or C" is intended to mean X can include any combinations of A, B, and C. In other words, if X includes A; X includes B; X includes C; X includes both A and B; X includes both B and C; X includes both A and C; or X includes all A, B, and C, then "X includes A and/or B" is satisfied under any of the foregoing instances. Similarly, "X includes at least one of A, B, and C" is intended to be used as an equivalent of "X includes A, B, and/or C." In addition, the articles "a" and "an" as used in this application and the appended claims should generally be construed to mean "one or more" unless specified otherwise or clear from context to be directed to a singular form. Moreover, use of the term "an aspect" or "one aspect" throughout is not intended to mean the same implementation or aspect unless described as such.

The use of "including" or "having" and variations thereof herein is meant to encompass the items listed thereafter and equivalents thereof as well as additional items. Unless specified or limited otherwise, the terms "mounted," "connected," 'supported," and "coupled" and variations thereof are used broadly and encompass both direct and indirect mountings, connections, supports, and couplings. Further, "connected" and "coupled" are not restricted to physical or mechanical connections or couplings.

The use of the terms "a" and "an" and "the" and similar referents in the context of describing the disclosure (especially in the context of the following claims) should be construed to cover both the singular and the plural. Furthermore, recitation of ranges of values herein is merely intended to serve as a shorthand method of referring individually to each separate value falling within the range, unless otherwise indicated herein, and each separate value is incorporated into the specification as if it were individually recited herein. Finally, the operations of all methods described herein are performable in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed.

It should be understood that although this disclosure uses terms such as first, second, third, etc., the disclosure should not be limited to these terms. These terms are used only to distinguish similar types of information from each other. For example, without departing from the scope of this disclosure, a first information can also be referred to as a second information; and similarly, a second information can also be referred to as a first information. Depending on the context, the words "if" as used herein can be interpreted as "when," "while," or "in response to."

While the disclosure has been described in connection with certain implementations, it is to be understood that the disclosure is not to be limited to the disclosed implementations but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. An onboard charger, comprising:
    a casing, comprising:
        a sidewall having a first height;
        an internal wall having a second height less than the first height;
        a top wall connecting the internal wall to the sidewall, wherein a channel is defined by the internal wall, the sidewall, and the top wall;
        an inlet in fluid communication with a first end of the channel;
        an outlet in fluid communication with a second end of the channel; and
        a first cover provided on a top surface of the sidewall; and
    a first heat-dissipating component arranged between the top wall and the first cover, wherein the first heat-dissipating component contacts the top wall.

2. The onboard charger of claim 1, further comprising a chamber wall arranged in the casing and outside the channel, wherein a chamber is defined by the chamber wall and the internal wall, and wherein a second heat-dissipating component is arranged in the chamber.

3. The onboard charger of claim 2, further comprising:
    a thermal-conductive material potted into the chamber for encapsulating the second heat-dissipating component, wherein the thermal-conductive material contacts the second heat-dissipating component and the internal wall.

4. The onboard charger of claim 2, wherein a gap is defined between the second heat-dissipating component and the internal wall.

5. The onboard charger of claim 2, wherein:
    a first cross-section of the channel near the inlet is larger than a second cross-section of the channel near the outlet;
    the onboard charger further comprises a third heat-dissipating component arranged near a portion of the channel having the second cross-section; and
    the third heat-dissipating component generates less heat than the first heat-dissipating component and the second heat-dissipating component.

6. The onboard charger of claim 2, further comprising:
    a power board provided between the first cover and the first heat-dissipating component, wherein electromagnetic components are mounted on the power board, and wherein the power board is connected to the first heat-dissipating component and the second heat-dissipating component.

7. The onboard charger of claim 6, wherein the first heat-dissipating component is mounted on the power board.

8. The onboard charger of claim 1, wherein a first cross-section of the channel near the inlet is larger than a second cross-section of the channel near the outlet.

9. The onboard charger of claim 1, further comprising:
    a clamp bar mounted to the top wall for pressing the first heat-dissipating component against the top wall.

10. The onboard charger of claim 9, further comprising a spring arranged between the clamp bar and the first heat-dissipating component.

11. The onboard charger of claim 1, further comprising:
    a ceramic substrate provided between the first heat-dissipating component and the top wall; and
    thermal grease provided on the ceramic substrate, wherein the thermal grease contacts the top wall and the first heat-dissipating component.

* * * * *